(12) United States Patent
Choi et al.

(10) Patent No.: US 8,458,624 B2
(45) Date of Patent: Jun. 4, 2013

(54) METHOD FOR MANUFACTURING SEMICONDUCTOR DEVICE BY CORRECTING OVERLAPPING SHOTS BASED ON A RADIATION INFLUENCED PATTERN

(75) Inventors: Jin Choi, Seoul (KR); Sang-hee Lee, Yongin-si (KR); Seong-june Min, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/192,124

(22) Filed: Jul. 27, 2011

(65) Prior Publication Data

US 2012/0047474 A1 Feb. 23, 2012

(30) Foreign Application Priority Data

Aug. 19, 2010 (KR) .................. 10-2010-0080409

(51) Int. Cl.
*G06F 17/50* (2006.01)
(52) U.S. Cl.
USPC ............... 716/52; 716/53; 716/54; 716/112
(58) Field of Classification Search
USPC ........................... 716/52–54, 112
See application file for complete search history.

(56) References Cited

U.S. PATENT DOCUMENTS

| 4,833,621 | A | * | 5/1989 | Umatate ................. 716/51 |
| 5,051,598 | A | * | 9/1991 | Ashton et al. ............ 250/492.2 |
| 6,274,290 | B1 | * | 8/2001 | Veneklasen et al. ......... 430/296 |
| 6,333,138 | B1 | * | 12/2001 | Higashikawa et al. ....... 430/296 |
| 6,345,211 | B1 | * | 2/2002 | Yu .................... 700/121 |
| 6,831,283 | B2 | * | 12/2004 | Yoda et al. ............. 250/492.22 |
| 6,897,454 | B2 | * | 5/2005 | Sasaki et al. ............ 250/492.1 |
| 7,657,863 | B2 | | 2/2010 | Iijima et al. |
| 7,754,401 | B2 | * | 7/2010 | Fujimura et al. .......... 430/30 |
| 8,017,289 | B2 | * | 9/2011 | Fujimura et al. .......... 430/30 |
| 2002/0127486 | A1 | * | 9/2002 | Saito ................... 430/30 |
| 2011/0189596 | A1 | * | 8/2011 | Fujimura et al. .......... 430/5 |
| 2011/0252386 | A1 | * | 10/2011 | Fujimura et al. .......... 716/53 |
| 2012/0058432 | A1 | * | 3/2012 | Choi et al. .............. 430/296 |
| 2012/0064440 | A1 | * | 3/2012 | Fujimura et al. .......... 430/5 |

FOREIGN PATENT DOCUMENTS

| KR | 1020080062699 A | 7/2008 |
| KR | 1020090098192 A | 9/2009 |

* cited by examiner

*Primary Examiner* — Naum Levin
(74) *Attorney, Agent, or Firm* — Myers Bigel Sibley & Sajovec, P.A.

(57) ABSTRACT

A method of manufacturing semiconductor devices is disclosed. The method includes determining fractured shots that do not overlap each other based on a final pattern; determining overlapping shots that are shots that overlap each other based on the final pattern; generating area difference data by comparing the areas of the overlapping shots and the fractured shots with each other; calculating a radiation influenced pattern based on the area difference data; and correcting the overlapping shots based on the radiation influenced pattern.

9 Claims, 10 Drawing Sheets

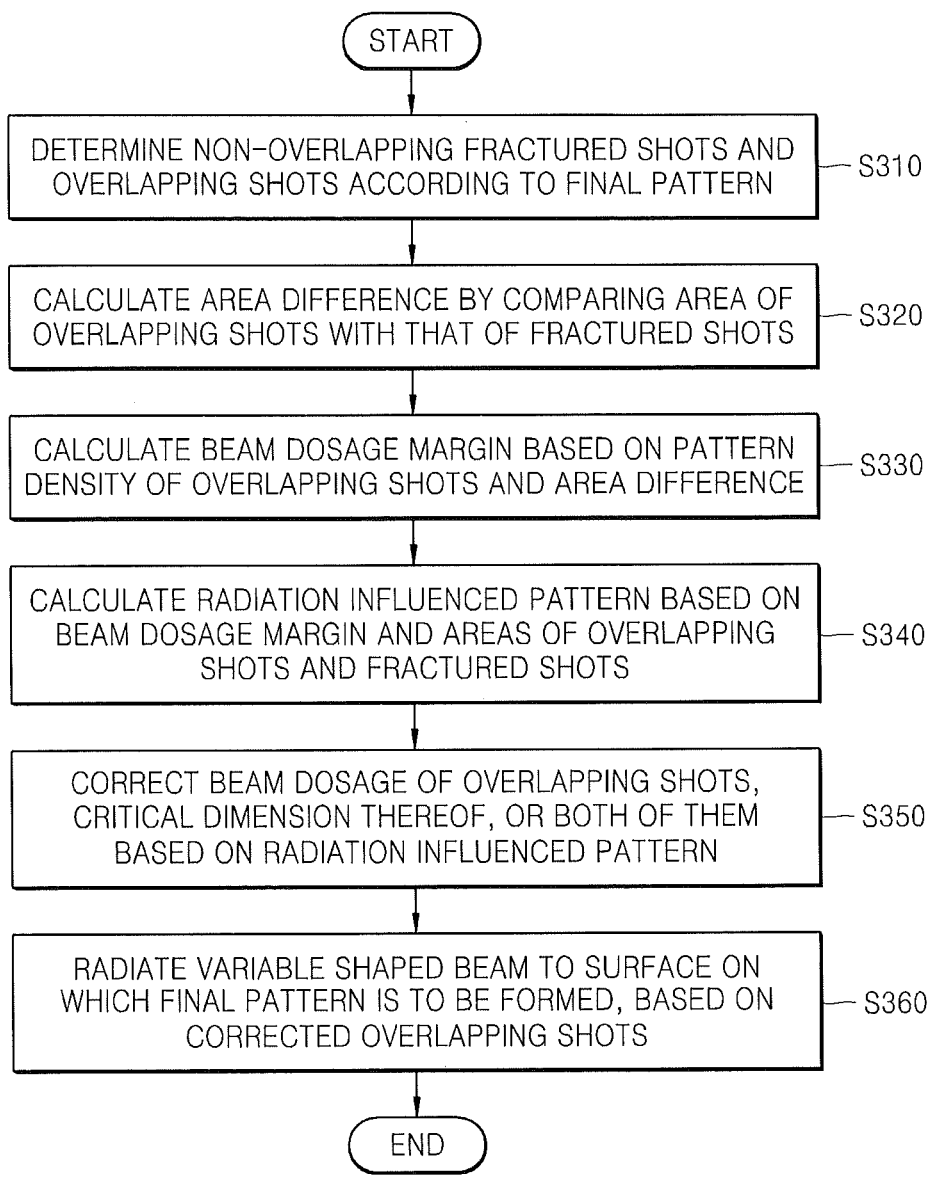

METHOD FOR MANUFACTURING SEMICONDUCTOR DEVICE BY CORRECTING OVERLAPPING SHOTS BASED ON A RADIATION INFLUENCED PATTERN

CROSS-REFERENCE TO RELATED APPLICATIONS

This application claims the benefit of Korean Patent Application No. 10-2010-0080409, filed on Aug. 19, 2010, in the Korean Intellectual Property Office, the disclosure of which is incorporated herein in its entirety by reference.

BACKGROUND

The inventive concept relates to a method of manufacturing semiconductor devices, and more particularly, to a method of generating an overlap pattern to manufacture semiconductor devices.

Semiconductor devices may be manufactured by using optical lithography. In optical lithography, a designed pattern is formed on a wafer by exposing the wafer to light through photomask. The photomask may have any shape according to a designed pattern.

SUMMARY

The inventive concept provides a method of manufacturing a semiconductor device by using overlapping shots obtained by correcting an error of a pattern due to the number of electrons diffused over a designed pattern.

According to an aspect of the inventive concept, there is provided a method of manufacturing a semiconductor device, the method including: determining fractured shots that do not overlap each other based on a final pattern; determining overlapping shots that are shots that overlap each other based on the final pattern; generating area difference data by comparing the areas of the overlapping shots and the fractured shots with each other; calculating a radiation influenced pattern based on the area difference data; and correcting the overlapping shots based on the radiation influenced pattern.

In some embodiments of the inventive concept, the correcting of the overlapping shots may include: correcting a critical dimension of the overlapping shots or a beam dosage for each of the overlapping shots.

In some embodiments of the inventive concept, the calculating of the radiation influenced pattern may include: calculating a pattern density based on the area of the overlapping shots; calculating a beam dosage margin based on the pattern density and the area difference data; and calculating the radiation influenced pattern based on the beam dosage margin and the area difference data.

In some embodiments of the inventive concept, the correcting of the overlapping shots may include: updating the overlapping shots based on data obtained by performing proximity effect correction (PEC) on the overlapping shots.

In some embodiments of the inventive concept, the method may further include: exposing a resist with which a reticle is coated based on the corrected overlapping shots; and forming a photomask based on the exposed reticle.

In some embodiments of the inventive concept, the method may further include exposing a surface on which a final pattern is to be formed based on the photomask.

In some embodiments of the inventive concept, the resist may be exposed to X rays, electron beams, ion beams, and/or extreme ultraviolet rays.

In some embodiments of the inventive concept, the resist may be exposed at least once based on the corrected overlapping shots.

In some embodiments of the inventive concept, the fractured shots and the overlapping shots may have substantially the same beam dosage.

According to another aspect of the inventive concept, there is provided a method of manufacturing a semiconductor device, the method includes: determining an area of fractured shots that do not overlap each other, and a first beam dosage for the fractured shots based on a final pattern; determining an area of overlapping shots that are shots that overlap each other, and a second beam dosage for the overlapping shots based on the final pattern; calculating a difference between the area of the fractured shots and the area of the overlapping shots and the number of surplus electrons by comparing the two areas with each other and comparing the first and second beam dosages with each other; and correcting the overlapping shots based on the area difference and the number of surplus electrons.

In some embodiments of the inventive concept, the calculating of the number of surplus electrons may include: generating dosage difference data based on the first and second beam dosages; and calculating the number of surplus electrons based on the dosage difference data and the area difference.

In some embodiments of the inventive concept, the correcting of the overlapping shots may include: calculating a pattern density based on the final pattern; calculating a dosage margin based on the pattern density and the number of surplus electrons; calculating the radiation influenced pattern based on the dosage margin and the difference between the areas of the overlapping shots and the fractured shots; and correcting the overlapping shots based on the radiation influenced pattern.

In some embodiments of the inventive concept, the correcting of the overlapping shots may include: correcting a vertical length and a horizontal length of each of the overlapping shots based on the area difference and the number of surplus electrons.

In some embodiments of the inventive concept, the correcting of the overlapping shots may include: correcting a beam dosage for each of the overlapping shots based on the area difference and the number of surplus electrons.

In some embodiments of the inventive concept, the correcting of the overlapping shots may include: calculating the real critical dimension based on the following equation:

$$CD_{real} = CD_{design} + \left(\frac{X_2 Y_2}{X_1 Y_1} - 1\right) \times \frac{\Delta CD}{\Delta \text{dose}/\text{dose}}$$

where $CD_{real}$ denotes a real critical dimension corresponding to the radiation influenced pattern, $CD_{design}$ denotes a critical dimension of an overlapping shot, $X_2 Y_2$ denotes an area of the overlapping shots, $X_1 Y_1$ denotes an area of the fractured shots, $\Delta CD$ denotes a variation in a critical dimension based on a pattern density, $\Delta \text{dose}$ denotes a variation in a beam dosage per unit area, and dose denotes the beam dosage per unit area.

In some embodiments of the inventive concept, the fractured shots and the overlapping shots may be determined by performing optical proximity correction (OPC) on the final pattern.

In some embodiments of the inventive concept, the variation in the critical dimension based on the pattern density may increase according to the pattern density.

According to another aspect of the inventive concept, there is provided a method of manufacturing a semiconductor device, the method including: determining fractured shots that do not overlap each other, and overlapping shots that overlap each other based on a final pattern; calculating an area difference by comparing areas of the overlapping shots and the fractured shots with each other; calculating a dosage margin based on a pattern density of the overlapping shots and the area difference; calculating a radiation influenced pattern based on the dosage margin and the areas of the overlapping shots and the fractured shots; correcting a beam dosage of the overlapping shots, a critical dimension of the overlapping shots, or both the beam dosage and the critical dimension based on the radiation influenced pattern; and radiating a variable shaped beam (VSB) to a surface on which the final pattern is to be formed based on the corrected overlapping shots.

In some embodiments of the inventive concept, the fractured shots and the overlapping shots may have at least one shape selected from a triangular shape, a rectangular shape, and a circular shape.

BRIEF DESCRIPTION OF THE DRAWINGS

Exemplary embodiments of the inventive concept will be more clearly understood from the following detailed description taken in conjunction with the accompanying drawings in which:

FIG. 11 is a flowchart of a method of manufacturing semiconductor devices, according to an embodiment of the inventive concept.

DETAILED DESCRIPTION OF THE EMBODIMENTS

Figure 1:
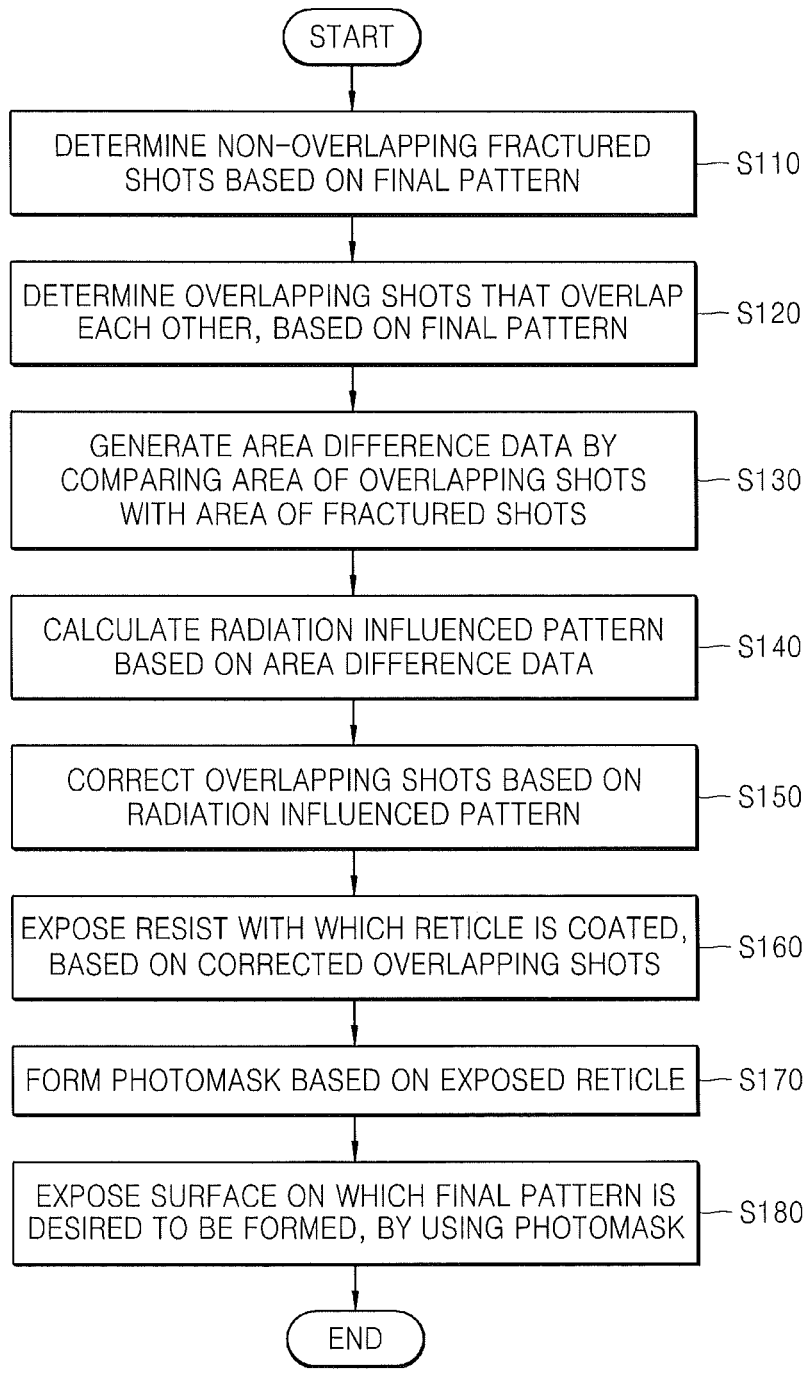
FIG. 1 is a flowchart of a method of manufacturing semiconductor devices, according to an embodiment of the inventive concept.

The inventive concept will now be described more fully with reference to the accompanying drawings, in which exemplary embodiments of the inventive concept are shown. A same reference number is allocated to a same element for different embodiments. The same element may be representatively explained only in a first embodiment and omitted in subsequent embodiments.

This inventive concept may, however, be embodied in many different forms and should not be construed as being limited to the exemplary embodiments set forth herein. Rather, these embodiments are provided so that this disclosure will be thorough and complete, and will fully convey the scope of the inventive concept to those of ordinary skill in the art. In the drawings, lengths and sizes of layers and regions may be exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept. For example, a first element discussed below could be termed a second element, and similarly, a second element may be termed a first element without departing from the teachings of this disclosure.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other expressions describing relationships between elements, such as, "between" and "directly between" or "adjacent to" and "directly adjacent to", will also be similarly understood.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Embodiments of the inventive concept are described herein with reference to cross-sectional illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as being limited to the particular shapes of regions illustrated herein but are to include deviations in shapes that result, for example, from manufacturing.

In the specification, a shot denotes a radiation of an electron beam onto an object to be processed, such as, a reticle, to have a variable shape to form a pattern, and a pass denotes a series of operations of radiating an electron beam for at least one shot to form a pattern. A single pass or a plurality of passes may be performed to form a pattern. All over the plurality of passes, electron beams may be radiated for identical shots or different shots.

FIG. 1 is a flowchart of a method of manufacturing semiconductor devices, according to an embodiment of the inventive concept.

Referring to FIG. 1, non-overlapping fractured shots may be determined based on a final pattern used to manufacture semiconductor devices, in operation S110. The final pattern may correspond to a pattern desired to be formed on a silicon wafer or a surface desired to be patterned. Determining fractured shots may include determining the area of the fractured shots or determining a beam dosage with respect to the fractured shots.

The fractured shots may be a plurality of shots that do not overlap one another and are necessary for forming the final pattern to serve as a mask. For example, each of the fractured shots may be determined by performing optical proximity correction (OPC) on the final pattern.

In operation S120, overlapping shots, that is, shots that overlap each other, may be determined based on the final pattern. The overlapping shots may be a plurality of shots that overlap one another and are necessary for forming the final pattern. Hereinafter, the fractured shots denote adjacent shots that do not overlap one another, and the overlapping shots denote shots that are overlapped with one another. Determining overlapping shots may include determining an area of the overlapping shots or determining a beam dosage with respect to the overlapping shots. In an embodiment of the inventive concept, if substantially the same beam dosage is applied to the fractured shots and the overlapping shots, only the areas of the fractured shots and the overlapping shots may be determined.

When compared with the use of the fractured shots, the use of the overlapping shots may reduce the number of shots required to form the entire pattern. When the fractured shots and the overlapping shots are exposed to electron beams not only by single pass exposure but also by multi-pass exposure in which a plurality of exposure operations are performed on each shot, the use of the overlapping shots may reduce the overall number of shots more than the use of the fractured shots. In a semiconductor device manufacturing method according to the inventive concept, electron beams may be radiated at least once to a surface on which a final pattern is desired to be formed based on overlapping shots.

However, surplus electrons may be generated in regions where the overlapping shots occur. This phenomenon may mainly occur at edges of a region where the overlapping shots occur. Accordingly, a critical dimension error is generated on the edges, thereby degrading the accuracy of the final pattern.

In some embodiments, a smaller beam dosage may be allocated to the overlapping shots than to the fractured shots. The beam dosage may include a shutter speed of a radiating device, which is used in a semiconductor device manufacturing method, that is, an exposure time of beams shot to a surface or the like. However, it is assumed in FIG. 1 that substantially the same beam dosage is applied to the overlapping shots and the fractured shots. When substantially the same beam dosage is applied to each unit area of the overlapping shots and each unit area of the fractured shots, a difference between the areas of the overlapping shots and the fractured shots may be proportional to a difference between a beam dosage for the overlapping shots and that for the fractured shots.

In operation S130, the areas of the overlapping shots and the fractured shots may be compared with each other to generate area difference data. Accordingly, the area difference data may include the area of the overlapping shots, the area of the fractured shots, and a difference between the two areas, that is, an area of a region where the overlapping shots are overlapped.

In operation S140, a radiation influenced pattern, which is substantially formed may be calculated based on the area difference data. Since electron beams are radiated twice on the region where the overlapping shots are overlapped as described above, the radiation influenced pattern may be severely distorted in the region where the overlapping shots are overlapped.

In operation S150, the overlapping shots may be corrected based on the radiation influenced pattern. The operation S150 of correcting the overlapping shots may include an operation of correcting a critical dimension of the overlapping shots or a beam dosage for each of the overlapping shots. A critical dimension or a beam dosage for each of the overlapping shots may be corrected. The critical dimension may be corrected vertically and horizontally. The operation S150 of correcting the overlapping shots will be described in greater detail later with reference to FIG. 2.

In operation S160, a resist with which a reticle is coated may be exposed based on the corrected overlapping shots. The resist may be a material sensitive to charged particle beams, X rays, or extreme ultra violet (EUV) rays to which the overlapping shots are exposed. In some embodiments, exposed portions of the resist may be removed or remain according to characteristics of the resist.

In operation S170, a photomask may be formed based on the exposed reticle. The reticle may include a circuit pattern. The reticle may function as the photomask and undergo processes such as etching, ion implantation, oxidization, and polishing to form an individual layer.

In other words, a surface on which the final pattern is desired to be formed may be exposed to light by using the photomask, thereby forming a pattern, in operation S180. In some embodiments, a semiconductor device may be manufactured using a maskless direct write method. In the maskless direct write method, a layer may be patterned by using particle beam lithography without forming a photomask.

In the semiconductor device manufacturing method according to the inventive concept, a variable shaped beam (VSB) may be used, an error of the final pattern may be reduced or minimized due to the correction of the overlapping shots, and the accuracy of the pattern may be enhanced.

Figure 2:
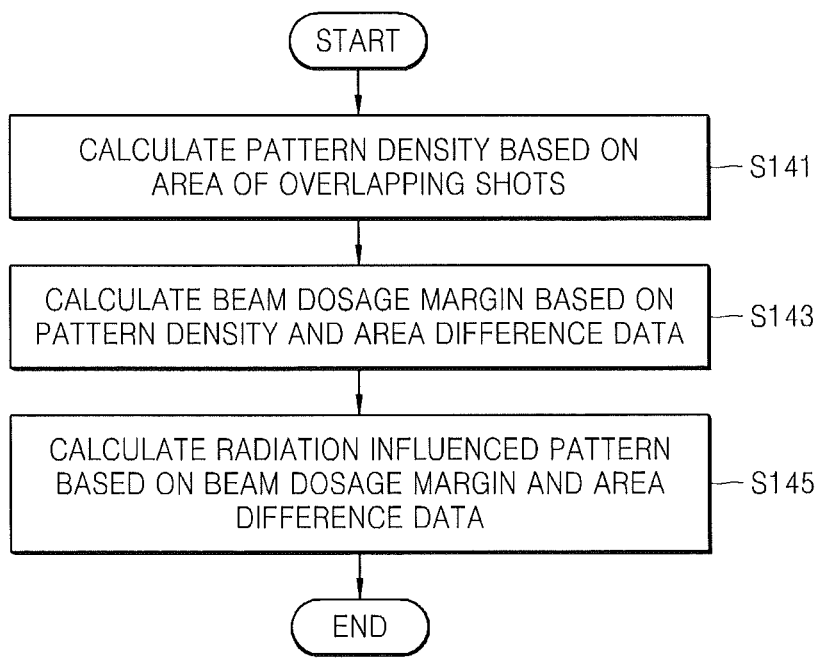
FIG. 2 is a flowchart of an operation of calculating a radiation influenced pattern for correcting overlapping shots, which is included in the method illustrated in FIG. 1.

FIG. 2 is a flowchart of the operation S150 of calculating a radiation influenced pattern for correcting the overlapping shots, which is included in the method illustrated in FIG. 1.

Referring to FIG. 2, a pattern density may be calculated based on the final pattern, in operation S141. The pattern density denotes an area of the entire area of a surface to be patterned occupied by the final pattern, and may be calculated based on the areas of the overlapping shots or the fractured shots. A variation of the critical dimension according to a beam dosage per unit area may depend on the pattern density.

In operation S143, a beam dosage margin may be calculated based on the pattern density and the area difference data. The beam dosage margin may be calculated based on a variation of the critical dimension and a ratio of the number of electrons additionally reaching each unit area when the overlapping shots are used as compared with when the fractured shots are used. Since substantially the same amount of beam radiation is applied to each unit area of the overlapping shots and each unit area of the fractured shots, the number of electrons additionally reaching each unit area, namely, the number of surplus electrons, may be calculated based on the area difference data. However, if different beam dosages are applied to each unit area of the overlapping shots and each unit area of the fractured shots, a special beam dosage calculation may be required to calculate the number of surplus electrons.

In operation S145, the radiation influenced pattern may be calculated based on the beam dosage margin and the area difference data. The radiation influenced pattern may correspond to the size of a pattern substantially formed on the surface by the overlapping shots on the basis of the beam dosage margin. Accordingly, since the size of the substantially formed pattern may be different from the desired final pattern, the overlapping shots may be corrected. The correction of the overlapping shots may be performed together with proximity effect correction (PEC). The proximity effect correction may correspond to distortion of a pattern caused due to the reaching electrons by adjacent shots. Accordingly, in the semiconductor device manufacturing method according to the inventive concept, an error of the final pattern may be reduced by correcting a distortion occurring in a region where patterns overlap each other as well as a distortion of a pattern caused by adjacent shots.

Figure 3A:
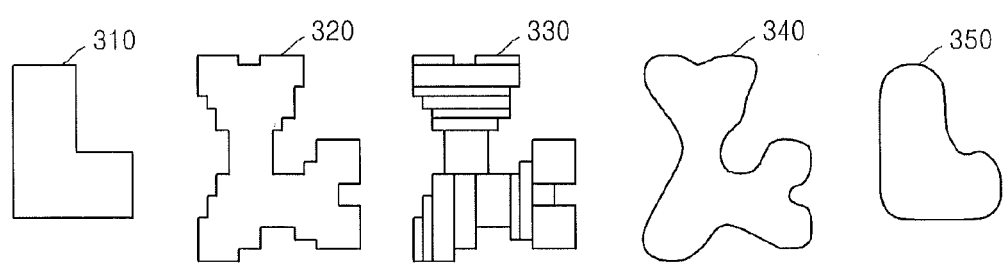
FIGS. 3A and 3B are diagrams for explaining determination of fractured shots and overlapping shots, according to an embodiment of the inventive concept.
Figure 3B:
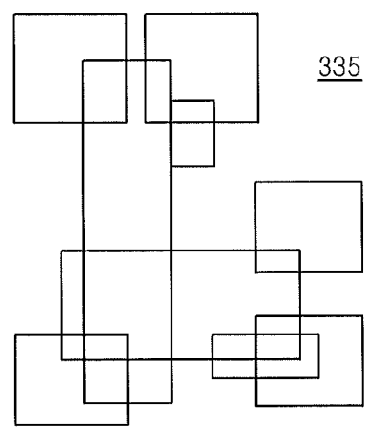

FIGS. 3A and 3B are diagrams for explaining determination of fractured shots and overlapping shots, according to an embodiment of the inventive concept.

Referring to FIG. 3A, a pattern 320 on which optical proximity correction (OPC) has been performed may be formed to form a final pattern 310, and fractured shots 330 may be formed based on the pattern 320.

The fractured shots 330 include a plurality of shots and are adjacent to one another without overlapping one another. It may be known from FIG. 3A that 18 fractured shots 330 form the final pattern 310. Since the fractured shots 330 are not allowed to overlap one another, the size of each shot may be small and also the number of shots may be relatively increased.

The shape of a photomask 340 formed based on the fractured shots 330 and the shape of a pattern 350 finally formed on the surface may become similar to the final pattern 310 due to a corner effect.

In a semiconductor device manufacturing method based on the fractured shots 330, the time required to perform the method may increase due to the large number of the fractured shots 330, and thus yield improvement may be limited, and controlling a semiconductor device manufacturing apparatus may be difficult due to the complexity of the shots 330.

FIG. 3B illustrates overlapping shots 335 that form the final pattern 310 of FIG. 3A. When compared with the fractured shots 330, the overlapping shots 335 include 9 overlapping shots, and thus are reduced by half in number from the number of fractured shots 330. Accordingly, when the overlapping shots 335 are used, the time required for the manufacturing method may be reduced. When compared with the fractured shots 330, the size of each of the overlapping shots 335 is relatively large, so that controlling the semiconductor device manufacturing apparatus may be easy.

Figure 4:
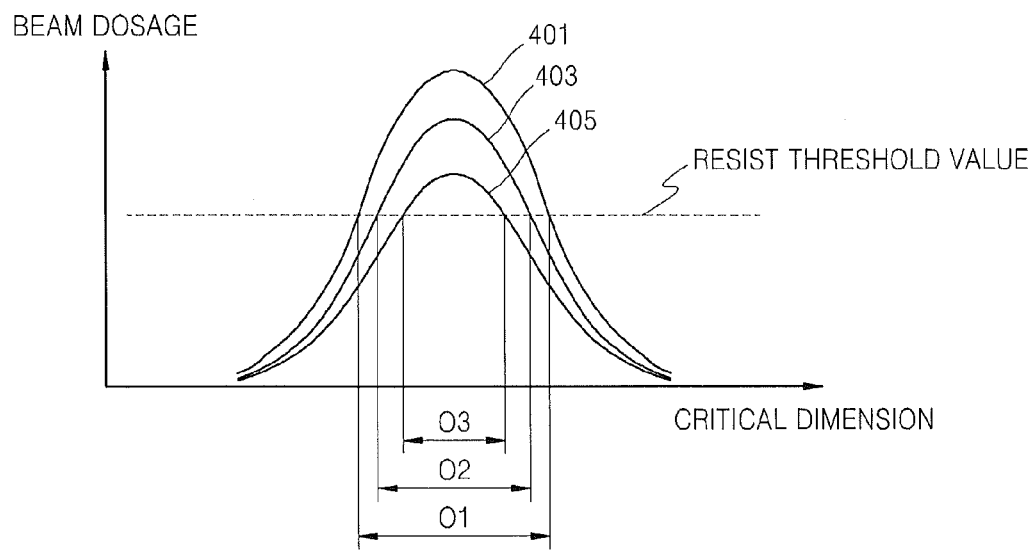
FIG. 4 is a graph showing a beam dosage versus a critical dimension of a pattern.

FIG. 4 is a graph showing a beam dosage versus a critical dimension.

Referring to FIG. 4, a region having a value higher than a resist threshold value which is constant is determined to be the critical dimension. In other words, when a resist with which a reticle is coated is exposed to a beam dosage equal to or greater than the resist threshold value, the resist is removed, and thus a pattern with a predetermined critical dimension is formed.

FIG. 4 illustrates a first shot 401 having a high beam dosage, a second shot 403 having a general beam dosage, and a third shot 405 having a low beam dosage. The magnitude of a beam dosage is relative and thus the absolute value of the beam dosage is not limited by the terminology, namely, either high or low. A beam dosage curve for each shot may have a Gaussian distribution.

The critical dimension of the first shot 401 corresponds to a first diameter 01. The critical dimension of the second shot 403 corresponds to a second diameter 02. The critical dimension of the third shot 405 corresponds to a third diameter 03. As the beam dosage for each shot increases, the number of electrons applied to the surface increases. Thus, a region exceeding the resist threshold value widens.

Based on this, it may be determined that the number of overall shots may be reduced due to the use of the overlapping shots. However, since the critical dimension increases due to an increase in the number of electrons reaching a region where the overlapping shots occur, correction of the overlapping shots is necessary.

Figure 5:
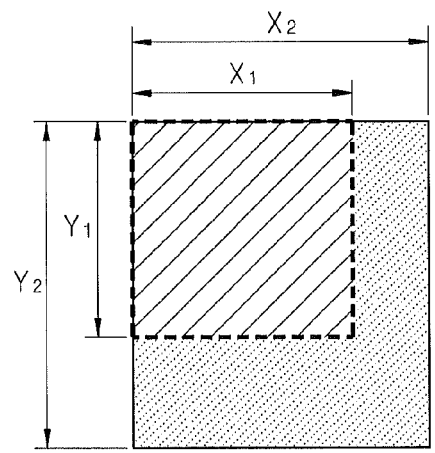
FIG. 5 is a diagram for explaining the concept of correction of overlapping shots, according to an embodiment of the inventive concept.

FIG. 5 is a diagram for explaining the concept of correction of overlapping shots, according to an embodiment of the inventive concept.

Referring to FIG. 5, $X_1$ and $Y_1$ indicate the critical dimension of the fractured shots, and $X_2$ and $Y_2$ indicate the critical dimension of the overlapping shots. FIG. 5 schematically illustrates a single rectangular shot in order to explain the concept of the areas of the fractured shots and the overlapping shots and beam dosages for the fractured shots and the overlapping shots.

For example, the overall area of the fractured shots may be represented as a product of the lengths of a horizontal length $X_1$ and a vertical length $Y_1$, and the overall area of the overlapping shots may be represented as a product of the lengths of a horizontal length $X_2$ and a vertical length $Y_2$. When substantially the same beam dosages are applied to each unit area of the fractured shots and each unit area of the overlapping shots as described above, the number of surplus electrons or a difference between the numbers of electrons reaching the fractured shots and the overlapping shots may correspond to a value $X_2Y_2-X_1Y_1$ obtained by subtracting the area of the fractured shots from the area of the overlapping shots.

When the value $X_2Y_2-X_1Y_1$ is divided by the overall area of the fractured shots, a ratio of an area where the overlapping shots occur and the entire pattern area may be obtained.

In the semiconductor device manufacturing method according to the inventive concept, the critical dimension of the overlapping shots may be corrected by determining a ratio of regions where the overlapping shots occur to the final pattern, surplus electrons additionally applied to the area where the overlapping shots occur, and a variation of the critical dimension depending on a beam dosage according to a pattern density. In some embodiments, a beam dosage for the overlapping shots may be corrected.

Figure 6:
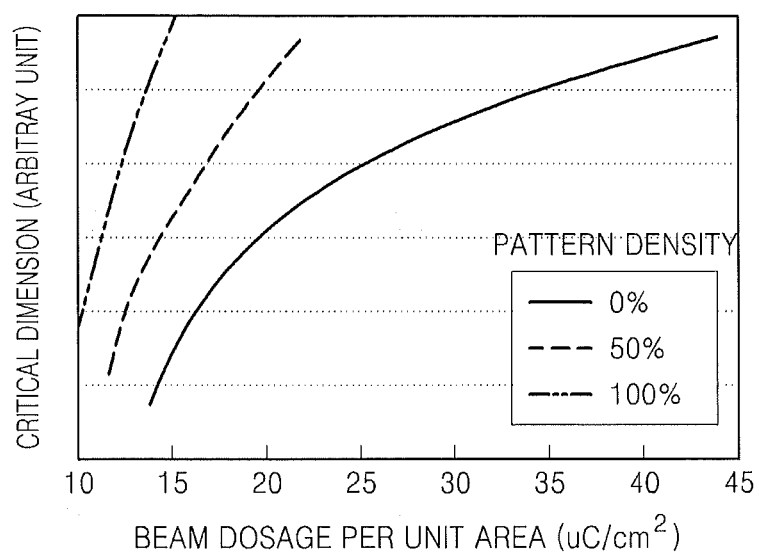
FIG. 6 is a graph showing a relationship between a beam dosage per unit area and a critical dimension based on a pattern density.

FIG. 6 is a graph showing a relationship between a beam dosage per unit area and a critical dimension according to a pattern density.

Referring to FIG. 6, although the beam dosage varies by the same degree, the critical dimension greatly varies when the pattern density is high.

For example, when the beam dosage per unit area is increased from 15 µC/cm² to 20 µC/cm², and the pattern density is 50%, the critical dimension is changed by two arbitrary units. When the beam dosage per unit area is increased from 15 µC/cm² to 20 µC/cm², and the pattern density is 0%, the critical dimension is changed by one arbitrary unit. The change in critical dimension may be different according to the pattern density and a variation of the beam dosage.

Referring to FIG. 6, a variation of the critical dimension may be determined according to a variation of the beam dosage. The variation of the beam dosage may correspond to an area variation if substantially the same beam dosage is applied to the fractured shots and the overlapping shots as in FIG. 1. Accordingly, an area where the overlapping shots occur may correspond to the variation in the beam dosage.

In Equation 1, $\Delta CD$ denotes a variation in the critical dimension, $\Delta dose$ denotes an increment of the total number of electrons, and dose denotes the number of electrons that depend on the beam dosage for fractured patterns.

$$DM \equiv \frac{\Delta CD}{(\Delta dose/dose)} \quad \text{[Equation 1]}$$

Referring to Equation 1, the beam dosage margin is determined based on a ratio of a beam dosage for each unit area when the fractured shots are used, that is, the number of electrons, to the number of electrons when the overlapping shots are used, and the variation in the critical dimension. The variation in the critical dimension may be determined according to the increment in the number of electrons.

Accordingly, the beam dosage margin may be calculated by referring to FIG. 6. The beam dosage margin may be calculated based on the area of each shot as described above, or if a beam dosage for each shot is determined, the beam dosage margin may be calculated based on the determined beam dosage.

$$CD_{real} = CD_{design} + \left(\frac{X_2 Y_2}{X_1 Y_1} - 1\right) \times DM \quad \text{[Equation 2]}$$

where $CD_{real}$ denotes a real critical dimension of the radiation influenced pattern, $CD_{design}$ denotes an initially designed critical dimension, that is, the size of the determined overlapping shots, $X_1 Y_1$ denotes the area of the fractured shots, $X_2 Y_2$ denotes the area of the overlapping shots, and DM denotes the above-described beam dosage margin.

The radiation influenced pattern may be calculated based on the beam dosage margin and the areas of the overlapping shots and the fractured shots. The critical dimension of the overlapping shots, the beam dosage thereof, or both of them may be corrected by comparing the critical dimensions of the overlapping shots one another, based on the calculation of the radiation influenced pattern.

In the semiconductor device manufacturing method according to the inventive concept, a semiconductor device may be manufactured by radiating variable shaped beams to overlapping patterns. In the semiconductor device manufacturing method according to the inventive concept, the area or beam dosage of the overlapping patterns may be corrected by calculating a critical dimension error that occurs, according to surplus electrons, in a region where the overlapping patterns, which are formed based on proximity effect correction, occur. Accordingly, the number of shots required to form a semiconductor device may be reduced due to the use of the overlapping patterns, and the accuracy of an actually drawn pattern may be enhanced.

Figure 7:
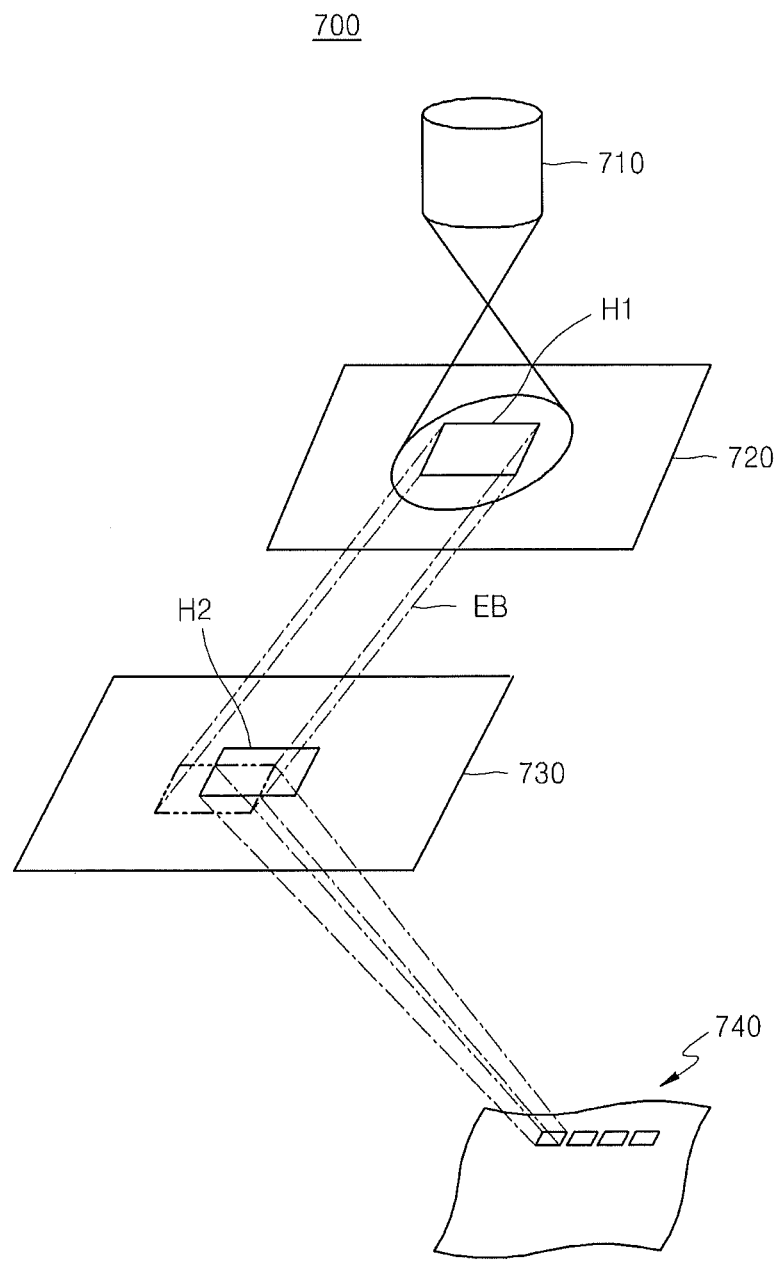
FIG. 7 illustrates a semiconductor device manufacturing apparatus for performing the method illustrated in FIG. 1.

FIG. 7 illustrates a semiconductor device manufacturing apparatus 700 for performing the method illustrated in FIG. 1.

Referring to FIG. 7, the semiconductor device manufacturing apparatus 700 may include an electron beam source 710, a first aperture 720, and a second aperture 730. The semiconductor device manufacturing apparatus 700 may radiate an electron beam EB to a processing target 740 and, although not shown, may include a platform that supports the processing target 740.

The EB may include X rays, electron beams, ion beams, ultraviolet beams. The EB is radiated and pass through the first aperture 720 and the second aperture 730 so as to be formed as different shots.

The first aperture 720 passes an EB received from the electron beam source 710 through a first hole H1, and the second aperture 730, which is below the first aperture 720, also passes only a specific part of the EB through a second hole H2. The EB is biased in a specific direction or the size thereof is changed, and then the EB reaches the processing target 740.

Accordingly, a specific shape may be drawn on the processing target 740 by the EB. However, the EB may be dispersed due to a proximity effect and a blurring effect caused by the EB.

The platform moves according to a horizontal shaft and a vertical shaft so as to adjust the location of the processing target 740, thereby adjusting a location that the EB is to reach. However, because an error may occur during the movement of the platform, the error due to the movement of the platform may be considered.

Figure 8:
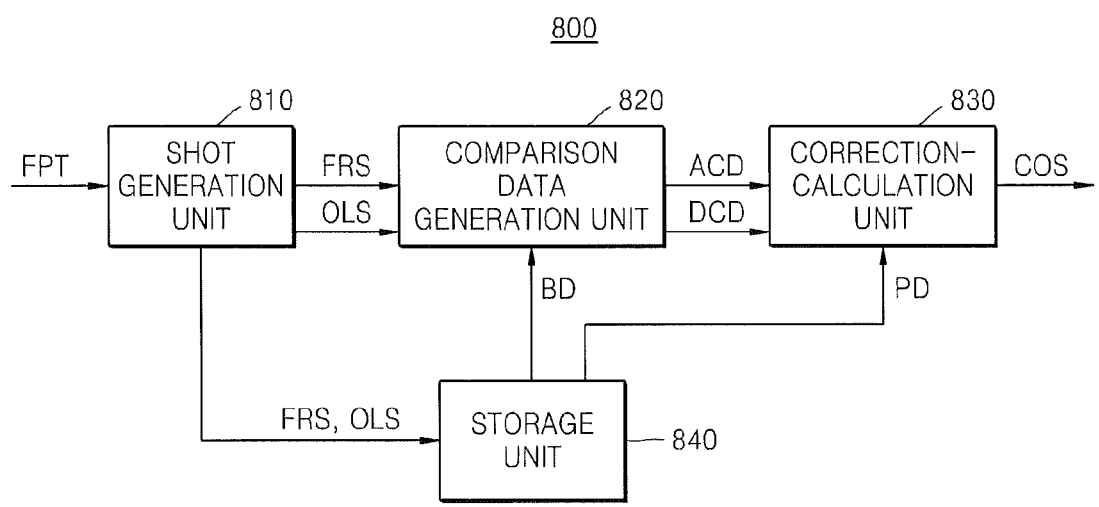
FIG. 8 is a block diagram of a manufacturing apparatus controller for controlling the semiconductor device manufacturing apparatus illustrated in FIG. 7.

FIG. 8 is a block diagram of a manufacturing apparatus controller 800 for controlling the semiconductor device manufacturing apparatus 700 illustrated in FIG. 7.

Referring to FIG. 8, the manufacturing apparatus controller 800 may include a shot generation unit 810, a comparison data generation unit 820, and a correction-calculation unit 830. In some embodiments, the manufacturing apparatus controller 800 may further include a storage unit 840 which stores data generated according to an operation.

The shot generation unit 810 generates fractured shots FRS and overlapping shots OLS according to a final pattern FPT. Each shot may be generated as a set, and the fractured shots FRS and the overlapping shots OLS may be generated due to optical proximity correction (OPC) and blurring correction. The shot generation unit 810 may set beam dosages for the fractured shots FRS and the overlapping shots OLS. For example, a beam dosage (BD) associated with the storage unit 840 may be determined for shots having a certain critical dimension. However, the determination of the BD may be performed in various ways.

The comparison data generation unit 820 may generate area difference data ACD and dosage difference data DCD by comparing the areas of the fractured shots FRS and the overlapping shots OLS with each other or the beam dosages thereof with each other. If substantially the same beam dosage is applied to the fractured shots FRS and the overlapping shots OLS, the area difference data ACD may be generated. On the other hand, if different beam dosages are applied to the fractured shots FRS and the overlapping shots OLS, the area difference data ACD and the dosage difference data DCD may be generated. The generated data may be stored in the storage unit 840.

The correction-calculation unit 830 may calculate a radiation influenced pattern according to the area difference data ACD or the dosage difference data DCD. The correction-calculation unit 830 may calculate a radiation influenced pattern COS by referring to a critical dimension variation PD, which depends on a beam dosage based on a pattern density stored in the storage unit 840, and to the area difference data ACD. In some embodiments, the correction-calculation unit 830 may calculate the radiation influenced pattern COS according to the area difference data ACD and the dosage difference data DCD.

Because the calculated radiation influenced pattern COS may be different from the overlapping shots OLS, the overlapping shots OLS are corrected based on the radiation influenced pattern COS so as to increase the accuracy of the final pattern FPT. The radiation influenced pattern may be calculated based on Equations 1 and 2 described above.

Accordingly, the semiconductor device manufacturing apparatus 700 for performing the semiconductor device manufacturing method of FIG. 1 may form a final pattern on the basis of overlapping shots that have been corrected based on the radiation influenced pattern COS calculated in the manufacturing device controller 800. Possible distortion of the final pattern may be reduced by using the overlapping shots to form the final pattern, and a desirable or optimal number of electron beams are used to form the final pattern, thereby reducing the amount of energy consumed to manufacture semiconductor devices.

Figure 9:
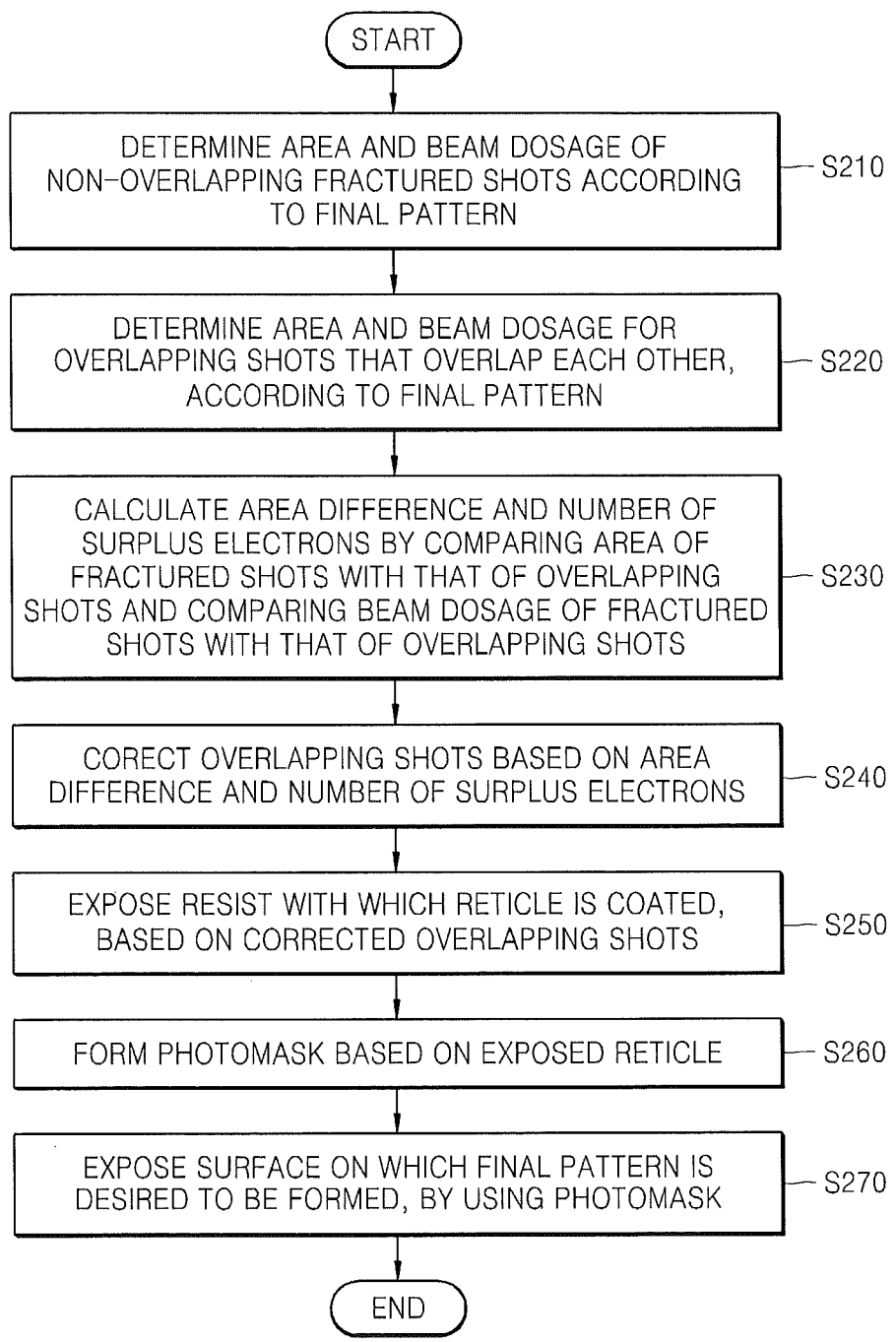
FIG. 9 is a flowchart of a method of manufacturing semiconductor devices, according to an embodiment of the inventive concept.

FIG. 9 is a flowchart of a method of manufacturing semiconductor devices, according to an embodiment of the inventive concept.

Referring to FIGS. 8 and 9, the shot generation unit 810 may determine an area and a beam dosage of non-overlapping fractured shots according to a final pattern, in operation S210. The beam dosage for the fractured shots may be stored as information associated with the size or characteristics of the fractured shots in the storage unit 840. For example, the beam dosage for the fractured shots may be indicated by a first beam dosage.

In operation S220, an area and a beam dosage for overlapping shots may be determined based on the same final pattern. In some embodiments, a smaller beam dosage may be allocated to the overlapping shots than to the fractured shots. The beam dosage for each shot may be determined in the shot generation unit 810. For example, the beam dosage for the overlapping shots may be indicated by a second beam dosage. Compared with the semiconductor device manufacturing method of FIG. 1, in the semiconductor device manufacturing method of FIG. 9, different beam dosages may be allocated to the fractured shots and the overlapping shots, and the overlapping shots may be corrected in consideration of the different beam dosages.

In operation S230, the correction-calculation unit 830 may calculate an area difference and the number of surplus electrons by comparing the area and beam dosage of the fractured shots with those of the overlapping shots, respectively. The area difference may be calculated by comparing the area of the fractured shots with that of the overlapping shots, and the number of surplus electrons may be calculated based on a difference between the beam dosages of the fractured shots and the overlapping shots. In some embodiments, the comparison between the areas of the fractured shots and the overlapping shots may be performed by the comparison data generation unit 820.

In operation S240, the overlapping shots may be corrected based on the area difference and the number of surplus electrons. The correction of the overlapping shots may be performed based on Equations 1 and 2 described above. The correction of the overlapping shots will be described in greater detail later with reference to FIG. 10.

In operation S250, a resist with which a reticle is coated may be exposed based on the corrected overlapping shots. In operation S260, the reticle may be formed as a photomask by removing a region exposed to a beam dosage higher than a resist threshold value from the resist by exposing the resist to light according to the corrected overlapping shots, similarly to the semiconductor device manufacturing method of FIG. 1. In some embodiments, the reticle may be formed as the photomask by removing a region not exposed to the beam dosage higher than the resist threshold value from the resist.

Figure 10:
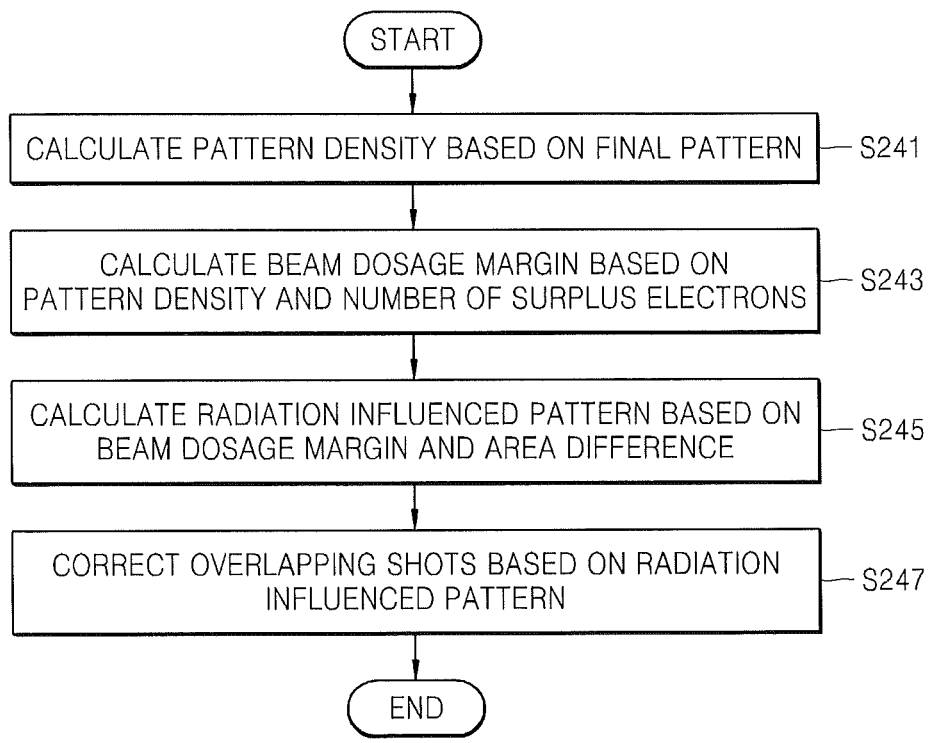
FIG. 10 is a flowchart of an operation of correcting overlapping shots, which is included in the method illustrated in FIG. 9.

FIG. 10 is a flowchart of the operation 240 of correcting the overlapping shots, which is included in the method illustrated in FIG. 9.

Referring to FIG. 10, the pattern density may be calculated based on the final pattern, in operation S241. In some embodiments, the pattern density may be calculated based on the area of the overlapping shots or the area of the fractured shots. As the pattern density increases, a variation in the critical dimension caused due to a difference between beam dosages for the overlapping shots and the fractured shots may occur.

In operation S243, a beam dosage margin may be calculated based on the pattern density and the beam dosage difference. The beam dosage margin may be calculated based on the number of surplus electrons calculated based on the difference between the beam dosages of the fractured shots and the overlapping shots. In other words, $\Delta CD/\Delta dose$ in Equation 1 may be determined according to the beam dosage difference by referring to the pattern density, and dose may be determined according to the beam dosage for the fractured shots.

In operation S245, the radiation influenced pattern may be calculated based on the beam dosage margin and the area of the overlapping shots. A real critical dimension corresponding to a designed critical dimension of each overlapping shot may be calculated based on the area of the fractured shots, the area of the overlapping shots, and the beam dosage margin by using Equation 2.

In operation S247, the overlapping shots may be corrected based on the radiation influenced pattern. The correction of the overlapping shots may be achieved by adjusting the horizontal or vertical length of real overlapping shots or adjusting a beam dosage with respect to the real overlapping shots.

Due to the correction of the overlapping shots, the radiation influenced pattern may be substantially the same as the final pattern.

FIG. 11 is a flowchart of a method of manufacturing semiconductor devices, according to an embodiment of the inventive concept.

Referring to FIG. 11, the shot generation unit 810 may determine non-overlapping fractured shots and overlapping shots according to a final pattern, in operation S310. The fractured shots have substantially the same pattern area as the overlapping shots except for a region where the overlapping shots occur.

In operation S320, the comparison data generation unit 820 may calculate an area difference by comparing the areas of the overlapping shots and the fractured shots with each other. If substantially the same beam dosage is applied to each unit area of the overlapping shots and each unit area of the fractured shots, a difference between the beam dosages for the overlapping shots and the fractured shots and the number of surplus electrons may be calculated based on the area difference.

In operation S330, a beam dosage margin may be calculated based on the pattern density and the area difference. The beam dosage margin may be calculated based on Equation 1 described above. The beam dosage margin may be calculated in the comparison data generation unit 820.

In operation S340, the radiation influenced pattern may be calculated based on the beam dosage margin and the areas of the overlapping shots and the fractured shots. The radiation influenced pattern may correspond to a critical dimension in which a surface is actually patterned by the overlapping shots. Accordingly, the overlapping shots may be corrected based on the radiation influenced pattern.

The correction of the overlapping shots may be performed with respect to the beam dosage of the overlapping shots or the critical dimension thereof, or both. If the beam dosage of the overlapping shots is corrected, a radiation duration or a dosage of electron beams radiated to the overlapping shots may be adjusted in a semiconductor device manufacturing apparatus. If the critical dimension of the overlapping shots is corrected, an area that EBs finally reach may be corrected by adjusting an angle or the like at which the EBs are radiated in the semiconductor device manufacturing apparatus 700.

In operation S360, a variable shaped beam may be radiated to a surface on which the final pattern is to be formed, based on the correction of the overlapping shots. Because generation of a photomask or other operations after the operation S360 of radiating the variable shaped beam to the surface are substantially the same as the operations of FIGS. 1 and 9, a detailed description thereof will be omitted.

While the inventive concept has been particularly shown and described with reference to exemplary embodiments thereof, it will be understood that various changes in form and details may be made therein without departing from the spirit and scope of the following claims.

That which is claimed:

1. A method, comprising:
   determining fractured shots that do not overlap each other based on a final pattern;
   determining overlapping shots that do overlap each other based on the final pattern;
   generating area difference data by comparing areas of the overlapping shots and the fractured shots with each other;
   calculating, using a computer, a radiation influenced pattern based on the area difference data; and
   correcting the overlapping shots based on the radiation influenced pattern.

2. The method of claim 1, wherein the correcting of the overlapping shots comprises:
   correcting a critical dimension of the overlapping shots or a beam dosage for each of the overlapping shots.

3. The method of claim 1, wherein the calculating of the radiation influenced pattern comprises:
   calculating a pattern density based on the area of the overlapping shots;
   calculating a beam dosage margin based on the pattern density and the area difference data; and
   calculating the radiation influenced pattern based on the beam dosage margin and the area difference data.

4. The method of claim 1, wherein the correcting of the overlapping shots comprises:
   updating the overlapping shots based on data obtained by performing proximity effect correction (PEC) on the overlapping shots.

5. The method of claim 1, further comprising:
   exposing a resist with which a reticle is coated based on the corrected overlapping shots; and
   forming a photomask based on the exposed reticle.

6. The method of claim 5, further comprising exposing a surface on which the final pattern is to be formed based on the photomask.

7. The method of claim 5, wherein the resist is exposed to X rays, electron beams, ion beams, and/or extreme ultraviolet rays.

8. The method of claim 5, wherein the resist is exposed at least once based on the corrected overlapping shots.

9. The method of claim 1, wherein the fractured shots and the overlapping shots have substantially the same beam dosage.

* * * * *